(12) United States Patent
Mulligan et al.

(10) Patent No.: US 6,961,049 B2
(45) Date of Patent: Nov. 1, 2005

(54) CAPACITIVE TOUCH SENSOR ARCHITECTURE WITH UNIQUE SENSOR BAR ADDRESSING

(75) Inventors: Roger C. Mulligan, White Rock (CA); Massoud Badaye, Vancouver (CA); Brian G. Lim, Vancouver (CA); Alex K. Wong, Vancouver (CA)

(73) Assignee: 3M Innovative Properties Company, St. Paul, MN (US)

( * ) Notice: Subject to any disclaimer, the term of this patent is extended or adjusted under 35 U.S.C. 154(b) by 352 days.

(21) Appl. No.: 10/176,564

(22) Filed: Jun. 21, 2002

(65) Prior Publication Data

US 2003/0234771 A1 Dec. 25, 2003

(51) Int. Cl.[7] .............................................. G09G 5/00
(52) U.S. Cl. ................................. 345/173; 178/18.06
(58) Field of Search ............................... 345/156, 173, 345/174; 178/18.01–18.06; 341/33; 200/600

(56) References Cited

U.S. PATENT DOCUMENTS

| | | | |
|---|---|---|---|
| 4,071,691 A | | 1/1978 | Pepper, Jr. |
| 4,290,052 A | * | 9/1981 | Eichelberger et al. ........ 341/33 |
| 4,293,734 A | | 10/1981 | Pepper, Jr. |
| 4,526,043 A | * | 7/1985 | Boie et al. ............. 73/862.046 |
| 4,659,874 A | | 4/1987 | Landmeier |
| 5,159,159 A | * | 10/1992 | Asher ...................... 178/18.05 |
| 5,262,778 A | | 11/1993 | Saunders |
| 5,650,597 A | | 7/1997 | Redmayne |
| 5,844,506 A | * | 12/1998 | Binstead ....................... 341/34 |
| 5,880,718 A | * | 3/1999 | Frindle et al. .............. 345/174 |
| 6,492,979 B1 | * | 12/2002 | Kent et al. .................. 345/173 |
| 6,670,949 B1 | * | 12/2003 | Ahn et al. ................... 345/173 |
| 6,825,833 B2 | * | 11/2004 | Mulligan et al. ........... 345/174 |
| 2003/0103043 A1 | * | 6/2003 | Mulligan et al. ........... 345/174 |
| 2003/0184523 A1 | * | 10/2003 | Badaye et al. .............. 345/173 |
| 2003/0213624 A1 | * | 11/2003 | Cross et al. ............. 178/18.06 |
| 2004/0017362 A1 | * | 1/2004 | Mulligan et al. ........... 345/173 |

FOREIGN PATENT DOCUMENTS

| | | |
|---|---|---|
| EP | 0 917 291 A2 | 5/1999 |
| GB | 2153078 | 8/1985 |

\* cited by examiner

*Primary Examiner*—Amare Mengistu
(74) *Attorney, Agent, or Firm*—Robert J. Pechman

(57) ABSTRACT

A capacitive touch sensor with symmetrical electrical interconnections for use with a touch sensor of a device is disclosed. The touch sensor includes several sensor bars, with a unique pair of lead lines coupled to each sensor bar. No inter-connection is provided between individual sensor bars. The sensor bars may be substantially transparent, and may comprise indium tin oxide. The touch sensor may be disposed on a viewing screen or proximate thereto. Also disclosed is a system for providing a signal for use in determining a touch location. The touch sensor receives an electrical field, receives a touch, and provides a signal representative of the modulation of the electrical field caused by the touch, wherein the modulation is a function of the location of the touch and the signal is suitable for use by controller to determine the location of the touch.

13 Claims, 8 Drawing Sheets

CAPACITIVE TOUCH SENSOR ARCHITECTURE WITH UNIQUE SENSOR BAR ADDRESSING

FIELD OF THE INVENTION

The present invention relates to a capacitive touch sensor architecture. More specifically, the invention relates to a capacitive touch sensor architecture that is capable of providing a substantially accurate control signal indicative of where the screen or sensor was touched.

BACKGROUND OF THE INVENTION

Touch screens are used in conjunction with a variety of display types, including cathode ray tubes (e.g., CRTs) and liquid crystal display screens (e.g., LCD screens), as a means of inputting information into a computer system. When placed over a display, the touch screen allows a user to select a displayed icon or element by touching the screen in a location that corresponds to the desired icon or element. Touch screens are becoming more prevalent data input interfaces as computers and other electronic devices become more ubiquitous. For example, touch screens may now be found in workshops, warehouses, manufacturing facilities, restaurants, on hand-held personal digital assistants, automatic teller machines, casino game-machines, and the like.

One type of touch screen, a capacitive touch screen, includes a capacitive sensor circuit with multiple sensor bars that each produce an electric field. Often, but not necessarily, the sensor circuit is laminated with an optically transparent protective substance, such as a glass pane. A touch in proximity of one or more of the sensor bars modulates the electric field and creates a signal. The signal passes from the sensor bars to a controller using a network of lead lines that electrically connect the sensor circuit to the controller. The controller resolves the signal or signals to determine the location of the touch on the screen. The X-Y coordinates of the location may then be communicated to another processor for further processing, such as to a computer for entering an order of an item displayed and selected on the screen.

The architecture of the conventional capacitive touch sensor affects the ability to accurately resolve the location of a touch. Conventionally, each lead line that connects the sensor bars to the controller is connected to multiple sensor bars. For that reason, a signal on a lead line can be indicative of a touch on more than a single sensor bar. Conventional touch sensor designs employ connection layouts that allow a comparison of signals present on lead lines of one side to signals on lead lines of the other side. The comparison allows the controller to resolve which of multiple sensor bars actually experienced the touch. In other words, the conventional touch sensor couples a different set of lead lines to each side of the sensor bars so that signals present on one side of the touch sensor in conjunction with signals present on the other side together uniquely define each sensor bar.

Touch screen designers are faced with the problem of designing touch screens and sensor circuits that are economical to manufacture and that will accurately establish the touch location.

SUMMARY OF THE INVENTION

The present invention is directed toward an apparatus and method for providing an improved capacitive touch sensor. The invention includes a plurality of parallel sensor bars configured for disposition on the screen. In one aspect, the invention provides a symmetrical architecture where each sensing bar is connected to a unique pair of lead lines, where one side of a sensing bar is connected to one lead line of a pair of lead lines and the other side of the sensing bar is connected to the other lead line of the pair of lead lines.

In another aspect, the invention can be configured to reduce the space occupied by the lead lines on the sides of the touch sensor. The invention arranges the lead lines such that the sum of lead lines disposed along two opposing edges of the touch sensor approximately equals the number of sensor bars.

In yet another aspect, a number of lead lines in a first group of lead lines is substantially equal to a number of lead lines in a second group of lead lines. The sensor bars of a touch sensor are oriented parallel to the tail. By routing the lead lines from one end of the sensor bars along both sides of the touch sensor, the amount of space necessary on the sides of the touch sensor is reduced so that either the host device may be made smaller without decreasing the size of the touch sensor, or the touch sensor may be made slightly larger without affecting the size of the host device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, which are schematic and not to scale, wherein.

DETAILED DESCRIPTION OF THE DRAWINGS EMBODIMENT

Figure 1:
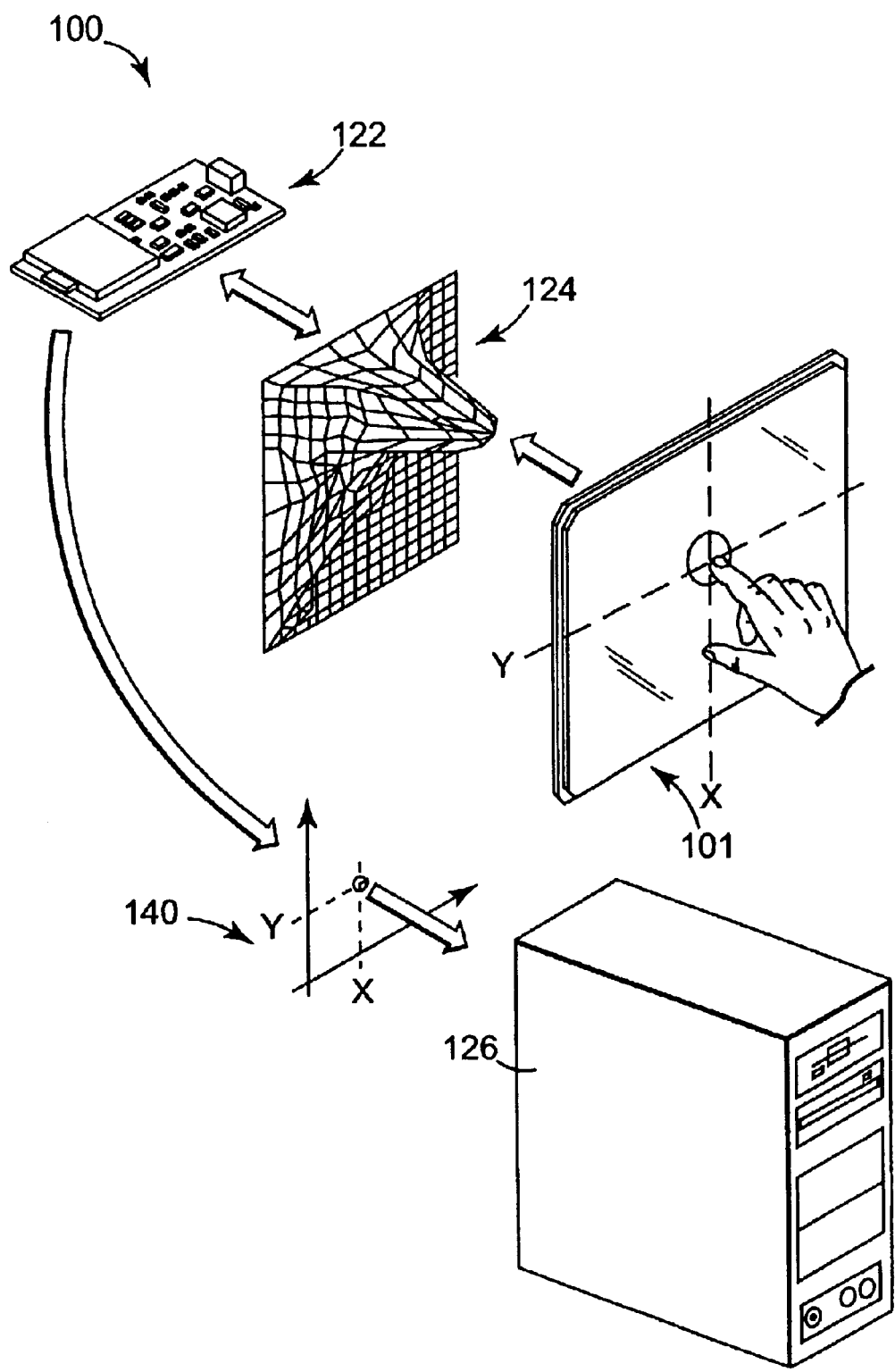
FIG. 1 is a schematic representation that illustrates an exemplary system overview.

In the following detailed description of exemplary embodiments of the invention, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is to be understood that other embodiments may be utilized, and other changes may be made, without departing from the spirit or scope of the present invention. The following detailed description is therefore not to be taken in a limiting sense, and the scope of the present invention is defined only by the appended claims.

Throughout the specification and claims, the following terms take the meanings explicitly associated herein, unless the context clearly dictates otherwise. The meaning of "a", "an," and "the" include plural references. The meaning of "in" includes "in" and "on." Referring to the drawings, like numbers indicate like parts throughout the views.

Additionally, a reference to the singular includes a reference to the plural unless otherwise stated or is inconsistent with the disclosure herein.

Briefly described, the present invention relates to a capacitive touch sensor architecture having discrete lead line connections to each of a plurality of sensor bars. The invention enables an accurate resolution of a touch location. The coordinate along the sensing bars is determined by the ratio of left and right signals received from the touched sensing bar. An imbalance in the electrical properties between the left and right portions of a sensor bar and its lead lines can create inaccuracies in the ratio, and adversely effect touch location determination. The touch sensor architecture of the invention provides for symmetrical or balanced electrical properties of a sensor bar and its lead lines by connecting each bar to a unique pair of lead lines. The electrical signal from the touched bar and its unique lead lines are available to a controller for determination of the touch location according to any appropriate method.

FIG. 1 is a schematic diagram illustrating the general principles of operation of a capacitive touch sensor. In FIG. 1, touch screen system 100 includes touch sensor 101, controller 122, and computer 126. In this particular embodiment, the touch sensor 101 includes a capacitive touch sensing layer, such as one constructed in accordance with the present invention, in addition to a standard glass layer.

In operation, controller 122 supplies an excitation waveform to the capacitive touch sensing layer of the touch sensor 101, producing an electric field in the capacitive touch sensing layer. When touch sensor 101 is touched, or closely approached, a detectable change or modulation occurs in the electric field due to capacitive coupling between the fingertip and the touch sensing layer. The change or modulation in the electric field creates a signal that is proportional to the proximity and location of the object to the touch sensor 101. The signal reflecting the change in the electric field is sensed by the controller 122. The controller 122 resolves the touch through one of several methods to achieve a set of Cartesian coordinates representing the location of the touch. Location graph 140 is a graphical representation of the actual location of the touch on the touch sensor 101. The coordinates of the touch location are provided to another device, for example to computer 126 for execution of a command displayed and touched on the screen. Throughout this specification, claims and drawings, a "touch" is deemed to occur when an object is in proximity to the touch sensor 101 such that a capacitive coupling occurs, thus causing modulation of the electric field. Physical contact need not occur. The object may be any of a number of electrically conductive things, such as a body part (typically a finger), or an inanimate object (typically a stylus).

Figure 2:
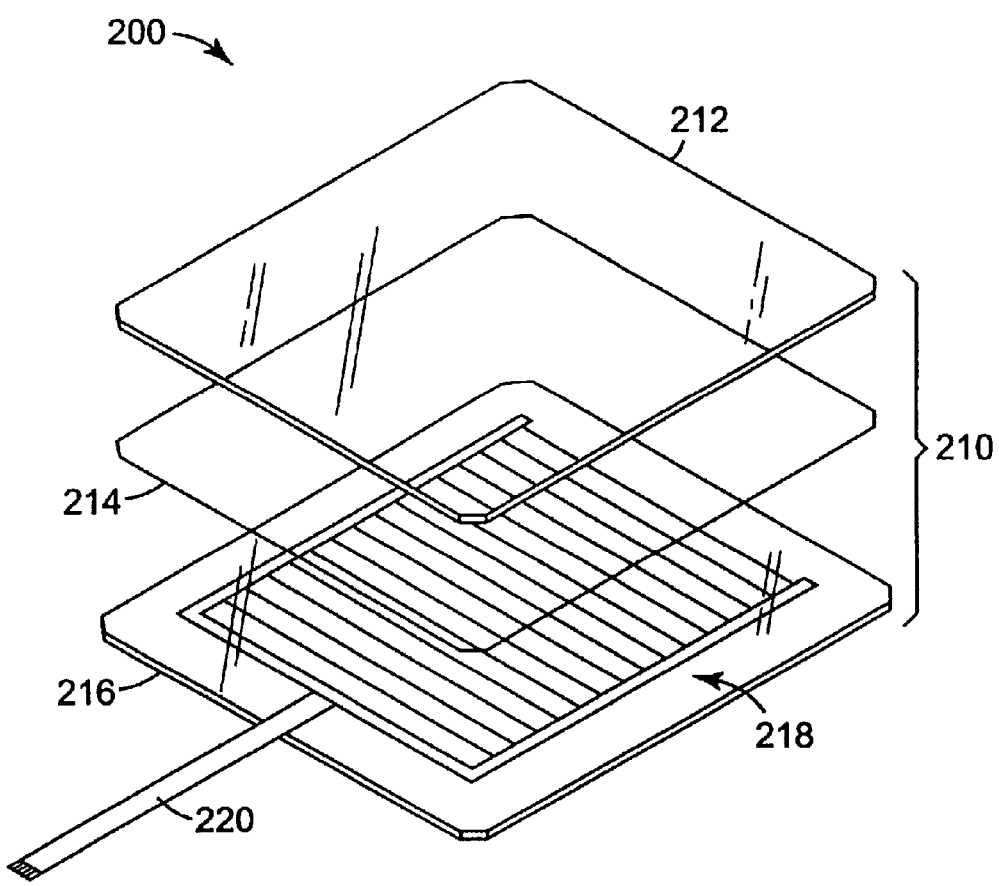
FIG. 2 is a schematic representation of an exemplary capacitive touch sensor in accordance with the invention.

FIG. 2 is an isometric view illustrating a capacitive touch sensor according to one embodiment of the present invention. In this embodiment, touch screen 200 includes touch sensor circuit 218, sensor circuit tail 220, first element 212, second element 216, and adhesive 214.

The touch screen 200 may include several layers. First element 212 and second element 216 represent protective substrates for the touch sensor circuit 218. These two elements typically can be any non-conductive substance, and may be manufactured from a chemically strengthened glass pane, a tempered glass pane, or other transparent material having similar qualities. In applications where optical transparency is not necessary, such as touch pad implementations, the first element 212 and the second element 216 need not be optically transparent or glass. Any suitable material may be used, such as plastic or other non-conductive material. In addition, in certain implementations it may be desirable to make the first element 212 and the second element 216 of a flexible material, such as polyester, to achieve a deformable or flexible touch sensor.

Adhesive 214 is disposed between first element 212 and second element 216. Touch sensor circuit 218 is disposed on second element 216, and communicates electrically with other circuitry through sensor circuit tail 220. The elements form a sandwich 210 adapted for use in conjunction with an LCD screen, a CRT screen, a touch pad, or any other device, whether visual or not. In an alternative embodiment, touch sensor circuit 218 may be secured or applied directly to the viewing surface of a LCD screen, a CRT screen, or other similar visual device, without second element 216.

In operation, touch sensor circuit 218 receives an electric signal from a controller and in turn produces an electric field, receives a touch to first element 212, and provides a signal outputted at sensor circuit tail 220 representing a modulation of the electric field due to the capacitive coupling between the touch and touch sensor circuit 218.

The advantages enabled by the invention create added flexibility to touch screen designers. For example, the improved accuracy of the sensor circuitry allows the use of a thicker protective element (e.g., first element 212) over the touch sensor circuit 218 while still maintaining the same resolution accuracy. For this reason, implementations of the invention may be made with replaceable or removable protective elements which tend to be larger than non-replaceable protective elements. Such an implementation has particular applicability in the area of outdoor kiosks or the like, where the weather or vandalism often causes damage to the outer protective element of the touch screen. The invention makes it more cost effective and practical to provide thicker, replaceable protective elements covering the touch sensor without any noticeable degradation in performance.

Figure 3:
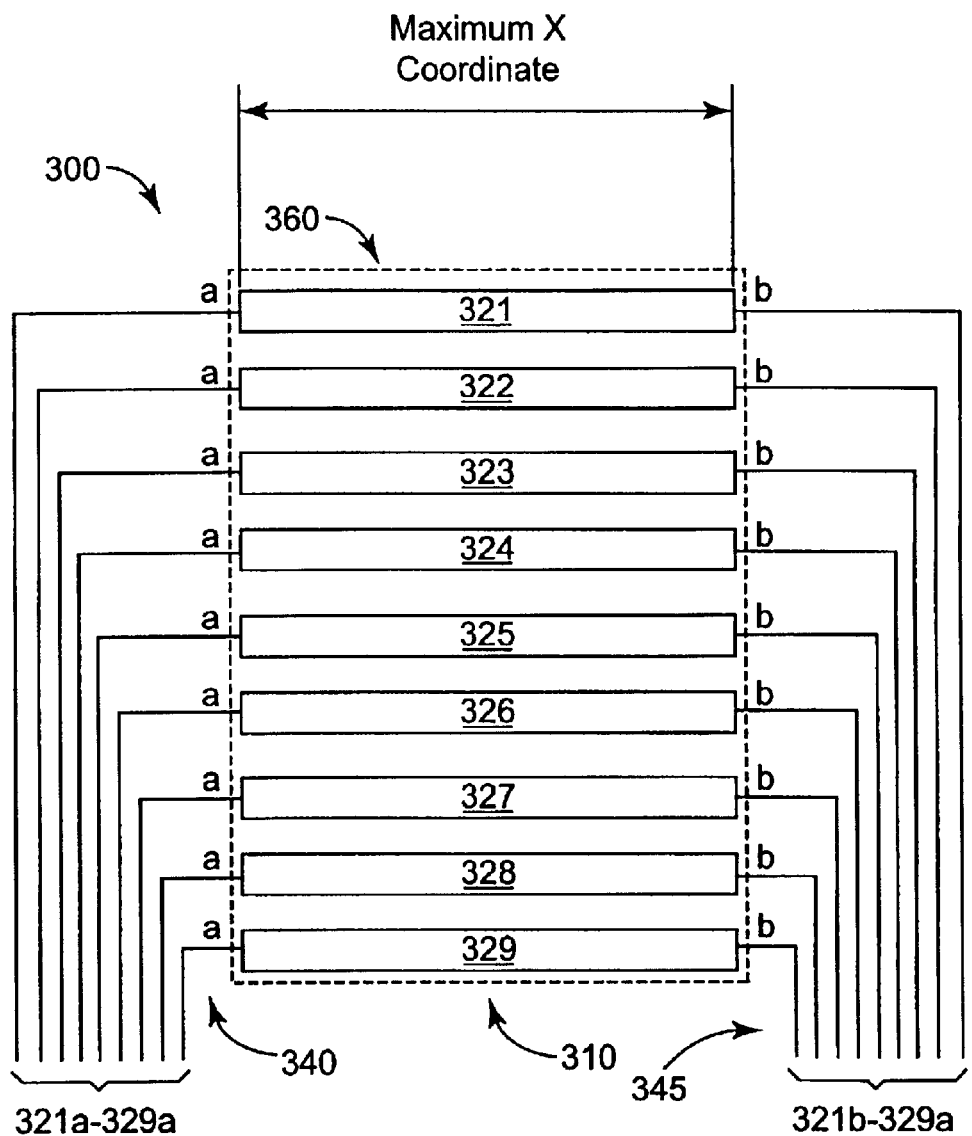
FIG. 3 is a schematic representation of an embodiment of a portion of a touch sensor in accordance with the invention.

FIG. 3 is a schematic representation of one implementation of the present invention showing an exemplary touch sensor circuit 300 for use in a touch-sensitive screen. In FIG. 3, touch sensor circuit 300 includes a plurality of sensor bars 310, a set of "a" side lead lines 340 comprising the individual "a" side lead lines 321a–329a, a set of "b" side lead lines 345 comprising the individual "b" side lead lines 321b–329b, and viewing surface perimeter 360.

More specifically, the touch sensor circuit 300 includes several touch-sensitive sensor bars 310 (the "bars") that span from one side to the other of viewing surface perimeter 360. In an alternative embodiment, the individual sensor bars of the plurality of sensor bars 310 are substantially parallel, or stated alternatively, are orientated lengthwise or disposed in a single direction. Sensor bars 310 preferably have electrical characteristics that are substantially linear over the length of the bars. They are preferably constructed of indium tin oxide (ITO) for optically transparent applications, but may be constructed of any suitable conductive material. The number of bars employed in any application can vary depending upon the design parameters of the particular application. FIG. 3 illustrates an embodiment with nine bars, 321–329.

In an alternative embodiment, the individual sensor bars of sensor bars 310 can be of various configurations and shapes other than a rectangle with conducting material deposited uniformly inside of a perimeter. For example, the individual sensor bars could comprise a conducting perimeter and a non-conducting area within the perimeter. The sensor bars can be any shape capable of creating an input signal in response to a touch, the signal being representative of the touch location.

In accordance with the invention, each sensor bar 310 is connected to its own unique pair of conductive lead lines. A lead line can be a wire, trace, or other circuit or system suitable for connecting a bar to a controller (122, FIG. 1). For example, bar 324 is connected at its first end to lead line 324a and at its second end to lead line 324b. Lead lines 324a and 324b are then connected to a controller, such as controller 122, FIG. 1. In one embodiment, "a" side lead lines 321a–321a and "b" side lead lines 321b–321b may be gathered into sensor circuit tail 220 having a conductive connector for connection to the controller. Although shown gathered into sensor circuit tail 220 in FIG. 2, any means will suffice for connecting the lines to a controller (not shown). In general, the lines may be made of practically any conductive material, such as copper, silver, gold, or the like. If the lines are printed onto film, the film is desirably non-reactive with the conductive material.

For simplicity of description, the lead lines connected to each side of any particular bar have the same designation. The "a" side lead lines 340 are on one side of touch sensor circuit 300, and "b" side lead lines 345 are on the other side of FIG. 3. Each sensor bar 321–329 is connected to the controller by its own unique pair of lead lines. For example, the ends of sensor bar 324 are connected to the controller by lead lines 324a and 324b. No other bar is connected to lead lines 324a or 324b. This feature of the invention allows each sensor bar to be uniquely addressed such that a signal present on a pair of lead lines can be immediately resolved to the particular sensor bar experiencing the touch. FIG. 3 illustrates that sensor bars 310 and their unique lead lines are laid out symmetrically and in such a manner that the "a" side lead line and "b" side lead line for each pair of lead lines connect to opposite ends of the same sensor bar. For the purpose of this description, bars that are adjacent to one another are termed "neighbors." The pitch and size of sensor bars 310 are selected such that a touch on any one bar produces reasonable signals on the bar's first and second nearest neighbors.

In operation, lead lines 340 and 345 receive an excitation waveform from a controller and provide it to sensor bars 310, which in turn generate an electric field. Touch sensor circuit 300 receives a touch to one or more of sensor bars 310, and in response provides a signal at one or more pair of unique lead lines 340 and 345. The signal represents a change in the electric field due to the capacitive coupling between the touch and the one or more of sensor bars 310.

Because every bar and its lead lines are not connected to any other sensor bar or lead lines, a touch to a touch-sensitive screen in the area of a bar, such as touch 346 near bar 328, will create a signal on the pair of lines connected to that bar (e.g., lines 328a and 328b) that is independent of any other bar or lines. In addition, the touch 346 may couple to neighbor bars (327 and 329). In such event, the touch will create unique signals on respective lines (327a–b, 329a–b) connected thereto, each signal being completely independent of any other bar or lead line. A touch to a screen embodying touch sensor circuit 300 should result in a peak signal on the touched bar, and lesser or decreasing signals on the adjacent neighbors of the touched bar. Thus, any touch to the screen should result in a pattern of unique, independent signals on the several lines connected to bars that are near the touch.

As will become clear later, the invention also allows the ability to accurately resolve where a touch occurred on the X axis because the symmetrical architecture provides a unique pair of lead lines for each sensor bar. This invention allows high accuracy in both X and Y directions. The invention also allows the ability to resolve where a touch occurred on the Y axis by analyzing the signals to identify the touched bars as well as the adjacent bars within which the touch occurred. A further advantage of the invention is that the lead lines can be formed in a single step because there are no crossovers or multiple connections. FIG. 3 provides one example of a sensor circuit created in accordance with the teachings of the invention.

Figure 4A:
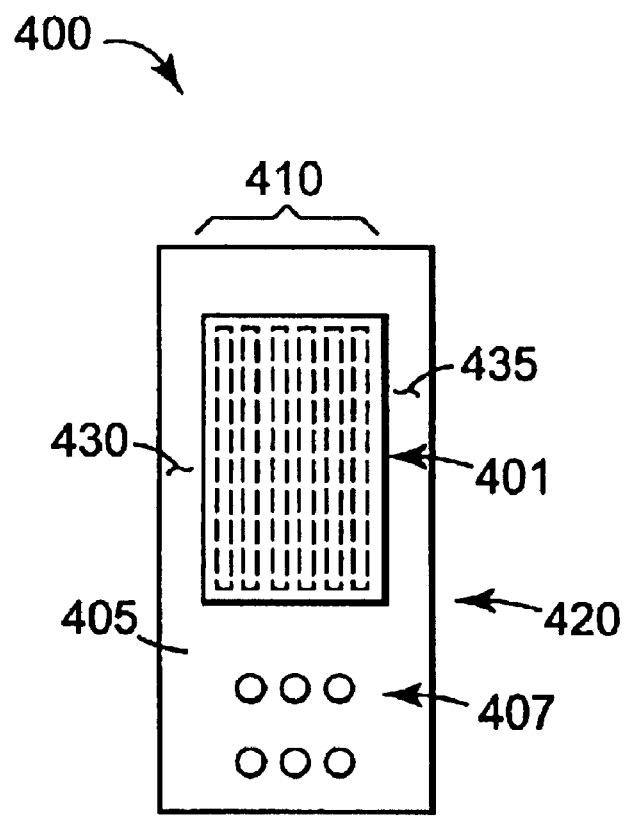
FIGS. 4*a*, 4*b* and 4*c* are schematic representations of a portion of a touch sensor in accordance with an alternative embodiment of the invention.
Figure 4B:
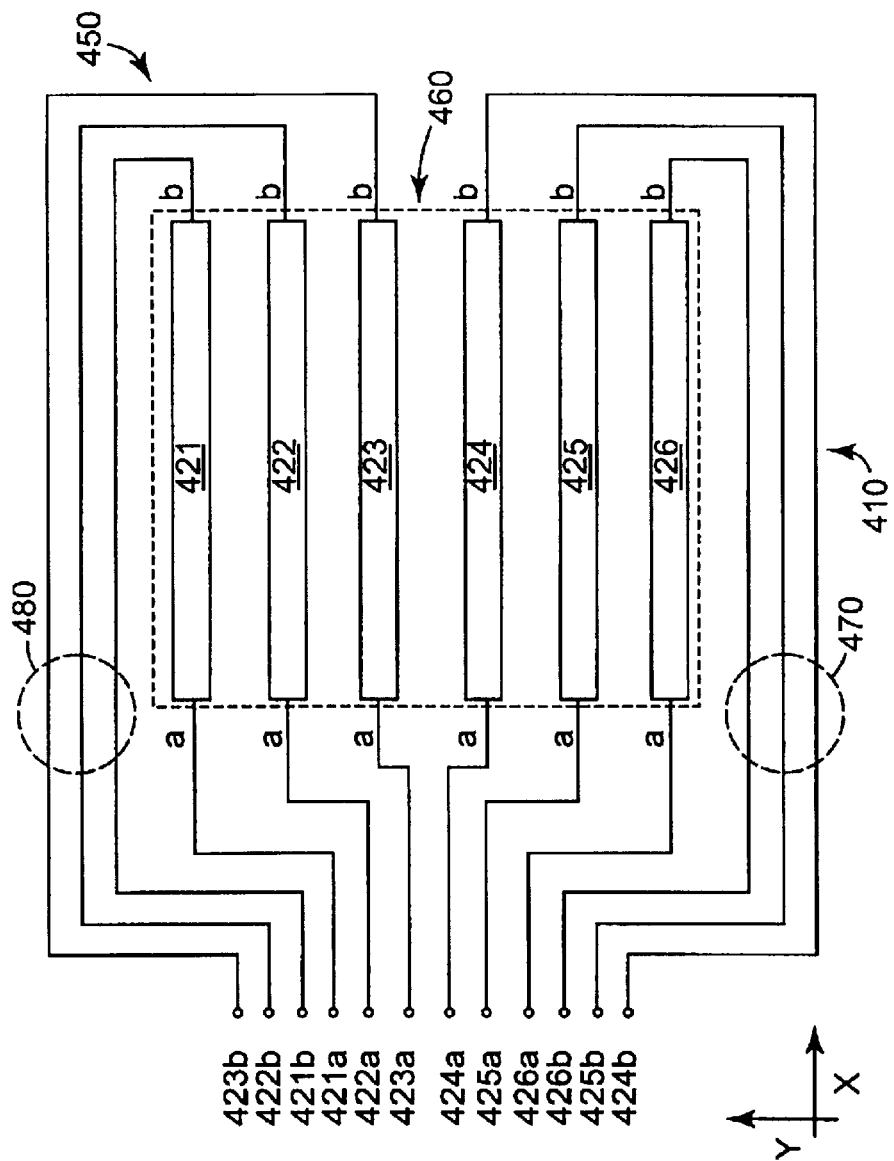

FIGS. 4A and 4B are schematic representations of a portion of a touch sensor in accordance with an alternative embodiment of the invention. FIG. 4a is a schematic representation of one implementation of a touch screen system 400. This implementation is embodied in a handheld device 420 having surface 405, keys 407, side areas 430 and 435, and a touch screen. The touch screen is composed of a touch sensor 401 having capacitive touch sensor bars 410 of a touch sensor circuit 450 (detailed in FIG. 4B). The touch sensor 401 is configured to operate in a substantially similar manner as touch screen system 100 illustrated in FIG. 1.

The handheld device 420 can be in the nature of a personal digital assistant (PDA) or other device where side areas 430 and 435 between touch sensor 401 and the perimeter of the device are kept small due to design limitations. It should be appreciated that the size of side areas 430 and 435 is exaggerated in the FIGURE for ease of illustration, and it is envisioned that the area of side areas 430 and 435 will be small with respect to the size of the handheld device 420. In the embodiment illustrated in FIG. 4a, the touch sensor circuit is orientated with vertical touch sensor bars 410, i.e., the bars are approximately parallel to side areas 430 and 435.

FIG. 4B illustrates additional details concerning the touch sensor 401 illustrated in FIG. 4A. Touch sensor circuit 450 includes a plurality of sensor bars 410, "a" side lead lines 421a–426a, "b" side lead lines 421b–426b, sensor bars 421–426, viewing surface perimeter 460 (illustrated by a dashed-line box), first group of lead lines 470, and second group of lead lines 480.

More specifically, the touch sensor circuit 450 includes a plurality of sensor bars 421–426 that span the touch sensor 401, illustrated by perimeter 460. Sensor bars 410 can be substantially parallel. In an alternative embodiment, sensor bars 410 can be orientated lengthwise or disposed in a single direction without necessarily being substantially parallel. Touch sensor circuit 450 is configured substantially similar to touch sensor circuit 300 of FIG. 3, except that lead lines 421b–426b are grouped into a first group of lead lines 470 and a second group of lead lines 480. The first group of lead lines 470 and the second group of lead lines 480 are routed so that (i) they are approximately parallel to sensor bars 410; (ii) they are on two opposing sides (a first side and a second side) of the screen perimeter 460; and (iii) the sum of the number of lead lines in first group of lead lines 470 and second group of lead lines 480 approximately equals the number of sensor bars 410.

In one embodiment, the number of lead lines in the first group of lead lines 470 is substantially equally to the number of lead lines in the second group of lead lines 480. By orienting the sensor bars 421–426 vertically with respect to the orientation of the handheld device 420, and by routing the lead lines from one end of the sensor bars 410 along both sides of the touch sensor 401, the amount of space necessary for side areas 430 and 435 is reduced so that either the handheld device 420 may be made smaller without decreasing the size of the touch sensor 401, or the touch sensor 401 may be made slightly larger without affecting the size of the handheld device 420. In other words, this lead line configuration reduces side areas 430 and 435, and allows the touch sensor 401 to occupy more of the width of the handheld device 420.

Figure 4C:
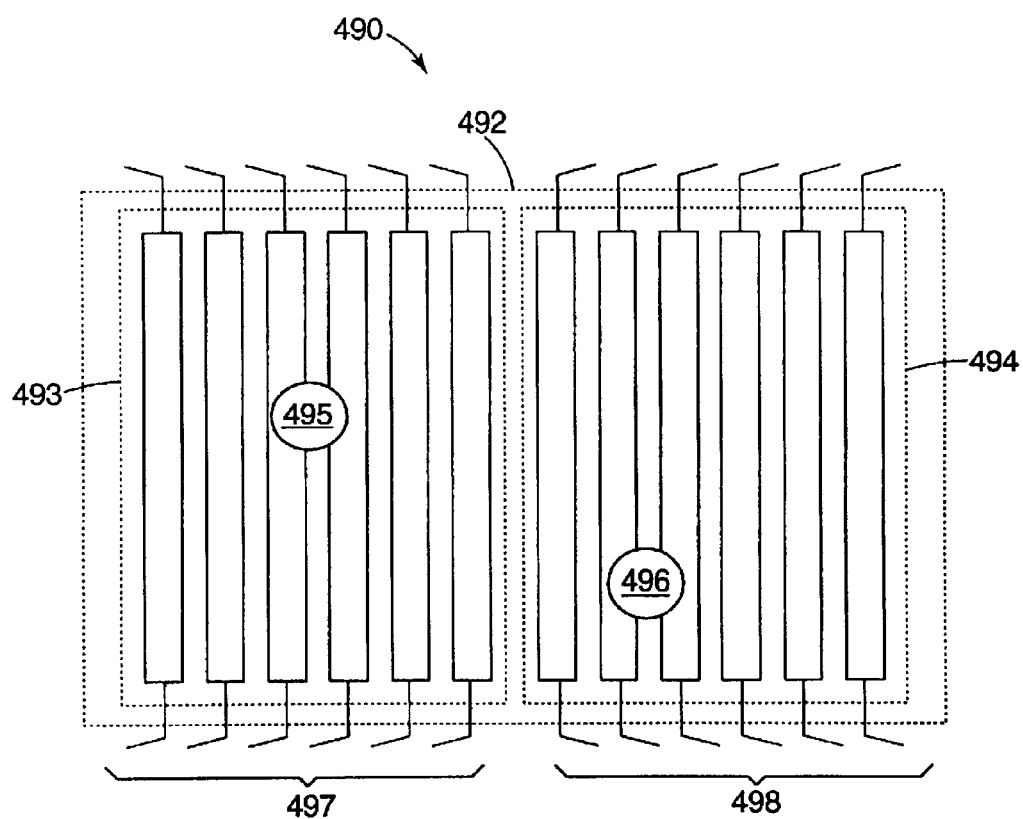

The configurations illustrated in FIGS. 4B and 4C may have particular applicability in entertainment activities where it is desirable to detect more than a single touch. For example, a gaming device could be constructed with an implementation of the touch sensor circuit 450 illustrated in FIG. 4B. The gaming device could provide separate user input areas on different parts of the touch screen. For instance, the gaming device may support a two-player game with separate side-by-side playing areas. Each of the separate playing areas may encompass different ones of the sensor bars 410. In this case, two separate, simultaneous touches (one in each playing area) could be easily detected because the touches would create signals on sensor bars having unique lead lines, so no ambiguity would be present.

Alternatively, the configuration illustrated in FIG. 4C could be used in a similar application to that just described. A touch sensor 490 is provided having, in this example, two input areas (493, 494). In this implementation, each input area (493, 494) includes six discretely addressed sensor bars, with each sensor bar being connected to a unique pair of lead lines. The sensor bars in the left-side input area 495 are connected to a first set of pairs of lead lines 497 in the manner described above. Likewise, the sensor bars in the right-side input area 494 are connected to a second set of pairs of lead lines 498. The lead lines for each input area may be connected to the same or a separate controller. Each input area (493, 494) may even be a separately assembled touch sensor unit mounted side-by-side to form an apparent single touch sensor 492. In this configuration, two separate touches (e.g., touch 495 and touch 496) may occur simultaneously, yet still be distinguished from each other. This configuration makes the touch sensor 490 of FIG. 4C particularly well suited in applications where multiple touches to the touch sensor 490 are likely to occur simultaneously, such as in a multi-user gaming environment. These are but a few of the many examples of specific implementations enabled by the present invention.

Figure 5:
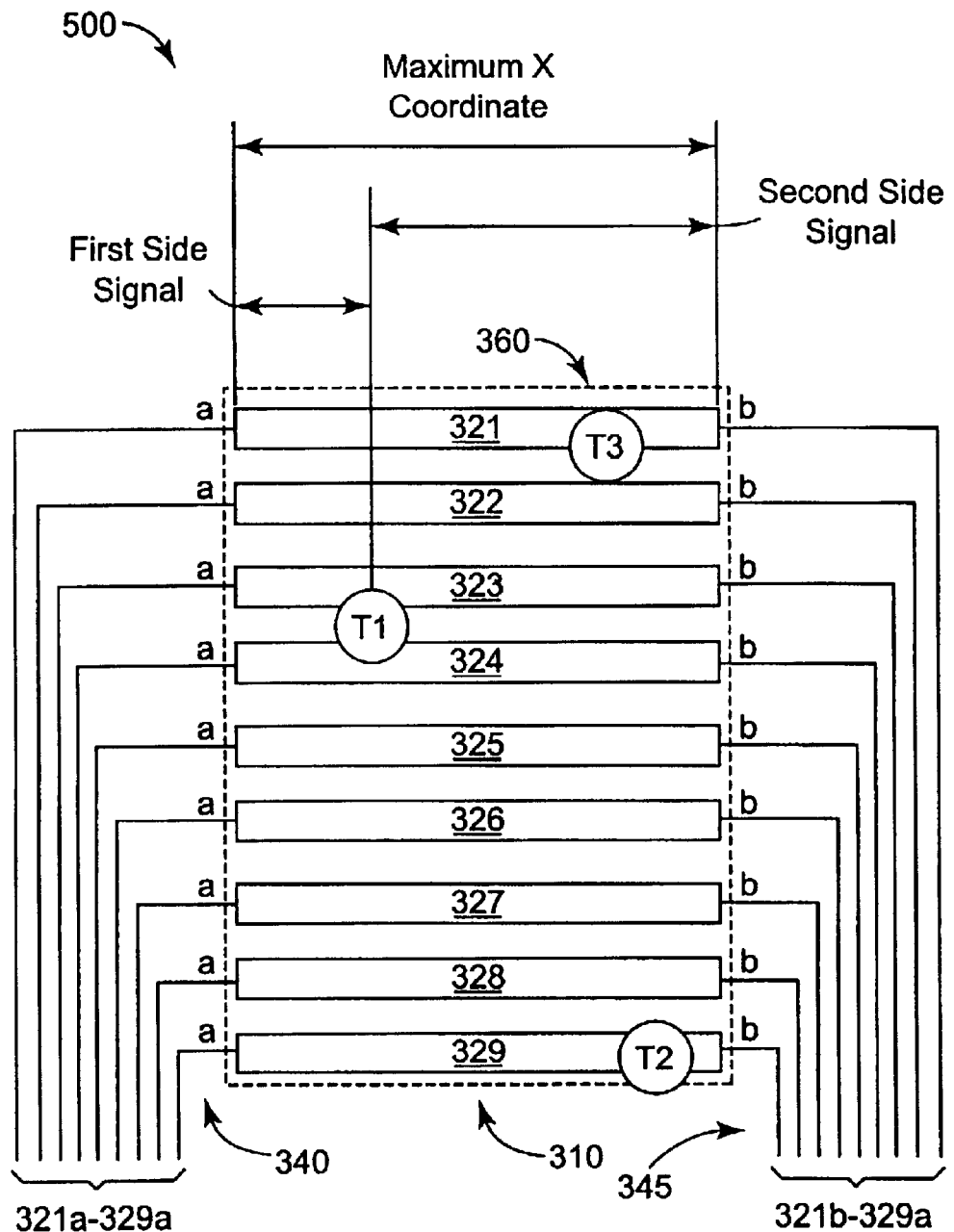
FIG. 5 is a schematic representation of a touch to a sensor bar in a touch sensor.

FIG. 5 illustrates an aspect of the invention where a controller operating in conjunction with the invention can resolve the X axis coordinate from the signal resulting from a touch. The configuration and operation of touch sensor 500 are substantially similar to touch sensor circuit 300 illustrated in FIG. 3. FIG. 5 is a schematic diagram illustrating a touch T1 on or near a sensor bar, and two alternative touches T2 and T3 near the perimeter of the sensor circuit.

To understand the method of coordinate resolution provided by the invention, it is important to recognize that a touch produces a peak signal on a given bar and a weaker signal on its neighbors by virtue of the distance from the touch. A graphical representation of these signals, when plotted in the same order as the bars, has a certain shape due to the strength of the signal falling off as a function of the distance from the touch. In FIG. 5, touches T1–T3 represent touches to the touch sensor 500 by a part of a person's body, a stylus, or other suitable apparatus. Touch T1 is located roughly between sensor bars 323 and 324. Touch T2 is generally on sensor bar 329 at the perimeter of sensor circuit 500. Touch T3 is generally between sensor bars 321 and 322 near the perimeter of sensor circuit 500.

The X coordinate is determined by the ratio of left and right signals. The symmetrical nature of the touch sensor architecture provides an advantage in resolving the X coordinate. At the physical midpoint (one-half the distance from one end of a sensor bar to its other end), the impedance of the "a" side of a bar and its lead line will be approximately equal to the impedance of "b" side of a bar and its lead line. Thus, the X coordinate location of a touch may be determined by evaluating the relative signal strengths on the lead lines of one side of the sensor to that of the other side.

Any acceptable algorithm may be implemented for determining the X coordinate, such as by assigning the X coordinate based on a comparison of the relative strengths of the signals presented on the lines connected to both sides of a bar receiving a touch. For instance, the X coordinate of touch T1 may be determined by implementing the following formula in software within the controller:

$$\frac{X \text{ Span} * \text{First Side Signal}}{(\text{First Side Signal} + \text{Second Side Signal})}$$

where the First Side Signal equates to a value related to the signal from bar 324, as sensed on line 324*a*, the Second Side Signal equates to a value related to the signal from bar 324*a* as sensed on line 324*b*. The X Span relates to the distance in the X direction from one side of the touch screen to the other. In an alternative, the First Side Signal and the Second Side Signal may be the values that result from the sum of strongest signals of a predetermined number of bars 310. Alternatively, the First Side Signal and the Second Side Signal may be any other values equal to or derived from one or more of the strongest signals. It will be appreciated that the above formula essentially calculates a weighting factor which is the ratio of the First Side Signal to the total signal, and applies that weighting factor to the total distance across the touch screen to compute the X coordinate. Other techniques known in the art may be used for calculating the X coordinate.

Figure 6A:
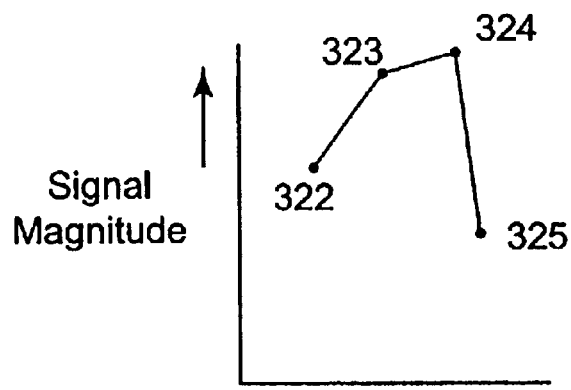
FIGS. 6*a*–6*c* are schematic diagrams showing a signal magnitude plot pattern for four neighboring sensor bars.
Figure 6B:
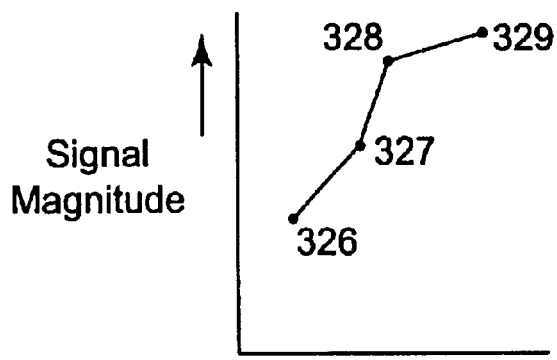
Figure 6C:
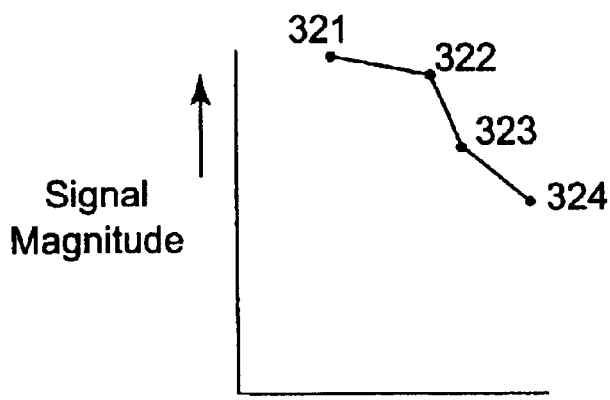

The Y coordinate is determined in a different manner. FIGS. 6*a*–6*c* are schematic diagrams showing a signal magnitude plot pattern for the touches illustrated in FIG. 5 for four neighboring sensor bars. FIG. 6 illustrates an aspect of the invention where a controller operating in conjunction with the touch sensor resolves the Y axis coordinate by identifying bars that have experienced a touch and analyzing the strongest signals on one or more lines, up to a predetermined number of lines. The controller identifies a group of lines having the strongest signals. The relative signals on the lines in the group allow the controller to determine the bar that was primarily touched.

Referring to FIG. 6*a*, the graphical representation of the signal strength or magnitude looks like a "bump" pattern since the outer most neighbors are weak and the touched bar is strong. The Y coordinate is first determined roughly by recognizing the bar carrying the peak signal, and may be fine tuned by interpolating between the peak signal and other signals. More specifically, as shown in FIG. 6*a*, touch T1 occurred closest to bar 324 as illustrated in FIG. 5. The contact also created a weaker signal on the two neighbor bars, 322 and 323. Finally, another bar 325 also experienced an even weaker signal. It will be appreciated that the signal pattern generated by touch T1 could deviate slightly from that shown in FIG. 6*a*, but should generally have the "bump" appearance with signal magnitude decreasing from a bar having a strongest signal. For example, the bar connected to line 324 could have the strongest signal, followed by 323, then 322, then 325. Many other combinations will also become readily apparent. Likewise, it is possible that two bars could have the same signal magnitude, such as if the touch occurred exactly between the two bars.

Similarly, at the bars on the perimeter of the sensor circuit 500 (the uppermost and lowermost bars as shown in FIG. 5), the signal may be strongest at the bar on the edge of the screen (either bar 321 or bar 329 shown in FIG. 5) and decrease as a function of the distance away from the bar experiencing the touch. For example, the signal magnitude apparent on each bar in a group may give an ascending signal pattern (FIG. 6*b*) or a descending signal pattern (FIG. 6*c*) depending on whether the contact was experienced at the lowermost or the uppermost portions of the screen (respectively). For example, touch T2 could result in the signal pattern illustrated in FIG. 6*b,* and touch T3 could result in the signal pattern illustrated in FIG. 6*c.*

The following examples, illustrations, and guidelines provide a description of a methodology for employing a sensor circuit in accordance with the invention to resolve the location of a touch. It should be noted that the examples, illustrations, and guidelines described herein are illustrative only and may be deviated from in certain measures without deviating from the spirit and scope of the invention.

A 7-inch touch screen was successfully fabricated employing the invention. It provided higher X coordinate accuracy than existing touch sensor designs. The invention is well suited for medium to small touch screens, such as those less than approximately nine inches, but may be employed in any application where high accuracy resolution is desirable. It will be appreciated that the present invention makes use of an increased number of lead lines with respect to many existing touch sensor designs, especially near field imaging designs. However, the increased area that may be required to route the additional lead lines is a design consideration that may either be ameliorated through some of the techniques that have been discussed earlier, or simply viewed as a trade-off for the increased accuracy.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A capacitive touch sensor comprising:
    a protective element covering a plurality of substantially parallel sensor bars arranged so that a touch on the protective element over one of the sensor bars produces measurable signals at least on that sensor bar and its first and second nearest neighbor sensor bars; and
    a plurality of pairs of lead lines, the pairs of lead lines matching in number the plurality of sensor bars, each pair of load lines being associated with a different one of the sensor bars, one lead line of a pair of lead lines being coupled to the associated sensor bar at a first end of the associated sensor bar and the other lead line of the pair of lead lines being coupled to the associated sensor bar at a second end of the associated sensor bar.

2. The capacitive touch sensor of claim 1, wherein the sensor bars and lead lines are disposed on a flexible substrate.

3. The capacitive touch sensor of claim 2, wherein the flexible substrate comprises polyester.

4. The capacitive touch sensor of claim 1, wherein the protective element is replaceable.

5. The capacitive touch sensor claim 1, wherein the sensor bars comprise substantially optically transparent material.

6. The capacitive touch sensor of claim 1, wherein the sensor bars comprise indium tin oxide.

7. The capacitive touch sensor of claim 1, wherein the touch sensor is configured to be disposed over a viewing surface of a display device.

8. The capacitive touch sensor of claim 1, wherein the plurality of sensor bars are bounded by a first side and a second side that are approximately perpendicular to the direction of the sensor bars, and wherein a first group of the lead lines is routed along the first side and a second group of the lead lines is routed along the second side.

9. The capacitive touch sensor of claim 1, wherein each lead line of a pair has approximately equal electrical properties.

10. The capacitive touch sensor of claim 1, wherein the touch sensor is divided into a plurality of input areas, each input area being associated with a different set of sensor bars from the plurality of sensor bars, and further comprising a controller configured to receive signals generated by the touch sensor and to identify locations of at least two simultaneously occurring touches, one of the simultaneous touches occurring in a first one of the plurality of input areas and another of the simultaneous touches occurring in a second one of the plurality of input areas.

11. The capacitive touch sensor of claim 10, wherein at least two of the plurality of input areas comprise a playing areas associated with an entertainment activity.

12. The capacitive touch sensor of claim 11, wherein the entertainment activity comprises an electronically performed game.

13. The capacitive touch sensor of claim 11, wherein the playing areas are arranged side-by-side.

* * * * *

UNITED STATES PATENT AND TRADEMARK OFFICE
CERTIFICATE OF CORRECTION

PATENT NO. : 6,961,049 B2  Page 1 of 1
APPLICATION NO. : 10/176564
DATED : November 1, 2005
INVENTOR(S) : Roger C. Mulligan It is certified that error appears in the above-identified patent and that said Letters Patent is hereby corrected as shown below:

Column 5
Line 13 (APPROXIMATELY), after "321a–" delete "321a" and insert -- 329a --, therefor.
Line 13 (APPROXIMATELY), after "321b–" delete "321b" and insert -- 329b --, therefor.

Column 10
Line 1, in Claim 1, delete "load" and insert -- lead --, therefor.
Line 15, in Claim 5, after "sensor" insert -- of --.

Signed and Sealed this

Twenty-eighth Day of November, 2006

JON W. DUDAS
*Director of the United States Patent and Trademark Office*